(12) United States Patent
Hwang

(10) Patent No.: US 7,713,775 B2
(45) Date of Patent: May 11, 2010

(54) CMOS IMAGE SENSOR

(75) Inventor: Sang-Il Hwang, Gangwon-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 188 days.

(21) Appl. No.: 11/964,546

(22) Filed: Dec. 26, 2007

(65) Prior Publication Data

US 2008/0164552 A1 Jul. 10, 2008

(30) Foreign Application Priority Data

Dec. 29, 2006 (KR) ............... 10-2006-0137546

(51) Int. Cl.
*H01L 29/75* (2006.01)

(52) U.S. Cl. ............... 438/69; 438/57; 438/65; 438/70; 438/72; 438/116; 257/432; 257/436; 257/440; 257/466

(58) Field of Classification Search ............ 438/57, 438/65, 69, 72, 116; 257/432, 436, 440, 257/466

See application file for complete search history.

(56) References Cited

U.S. PATENT DOCUMENTS

2006/0256442 A1* 11/2006 Hasei ............... 359/619
2007/0045513 A1* 3/2007 Lee et al. ............ 250/208.1

* cited by examiner

*Primary Examiner*—Edward Wojciechowicz
(74) *Attorney, Agent, or Firm*—Sherr & Vaughn, PLLC

(57) ABSTRACT

Embodiments relate to a CMOS image sensor and to a method for manufacturing a CMOS image sensor that may disperse stray beam between microlenses. According to embodiments, the method for manufacturing the CMOS image may include forming an interlayer dielectric layer on a semiconductor substrate including a plurality of photo diodes, forming a color filter layer corresponding to the photo diodes on the interlayer dielectric layer, forming a planarization layer on the color filter layer, forming microlenses on the planarization layer, after depositing an insulating layer over the microlenses, forming a trench in a concave lens shape in the insulating layer between the microlenses, and forming a concave lens gap-filling insulating materials inside the trench. In embodiments, concave lenses may be formed between microlenses in a CMOS image sensor and stray beams between the microlenses may be dispersed and recondensed into the microlenses.

19 Claims, 7 Drawing Sheets

Micro Lens

Micro Lens Gap

CMOS IMAGE SENSOR

The present application claims priority under 35 U.S.C. 119 and 35 U.S.C. 365 to Korean Patent Application No. 10-2006-0137546 (filed on Dec. 29, 2006), which is hereby incorporated by reference in its entirety.

BACKGROUND

A related art method for manufacturing a CMOS image sensor may use a defocus phenomenon and a reflow phenomenon.

FIG. 1 is a drawing showing an entire top image of a microlens, and FIG. 2 is a drawing showing the gap between microlenses. A microlens may be formed in a convex lens shape and may collect light to a photo diode.

Figure 3:
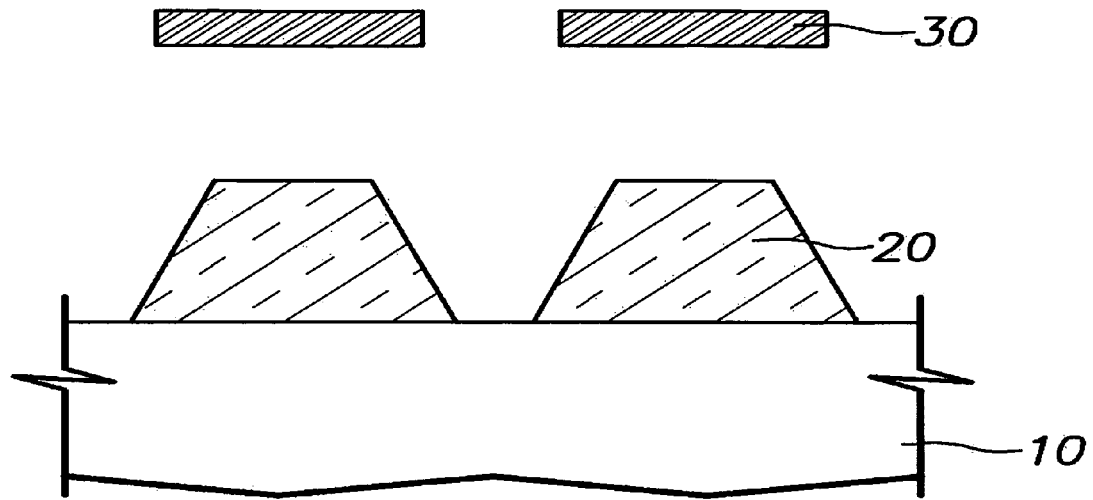
FIGS. 3 and 4 are process cross-sectional drawings for describing a method for manufacturing a microlens of an image sensor of the related art.
Figure 4:
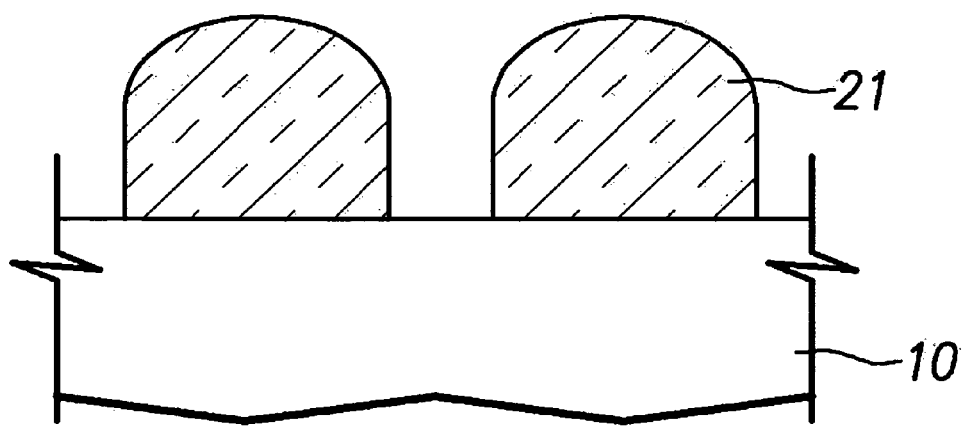

Referring to FIG. 3, photo resist (PR) is applied on transparent underlayer 10 and the photo resist is exposed using mask 30. Photo resist pattern 20 may be formed in a trapezoid shape using a defocus phenomenon. Photo resist pattern 20 may also be heated to a melting point. A reflow phenomenon where photo resist pattern 20 may be rounded, having fluidity, may be then generated. In accordance with the defocus phenomenon and the reflow phenomenon, micro lens 21 in a shape as illustrated in FIG. 4 may be formed.

Figure 5:
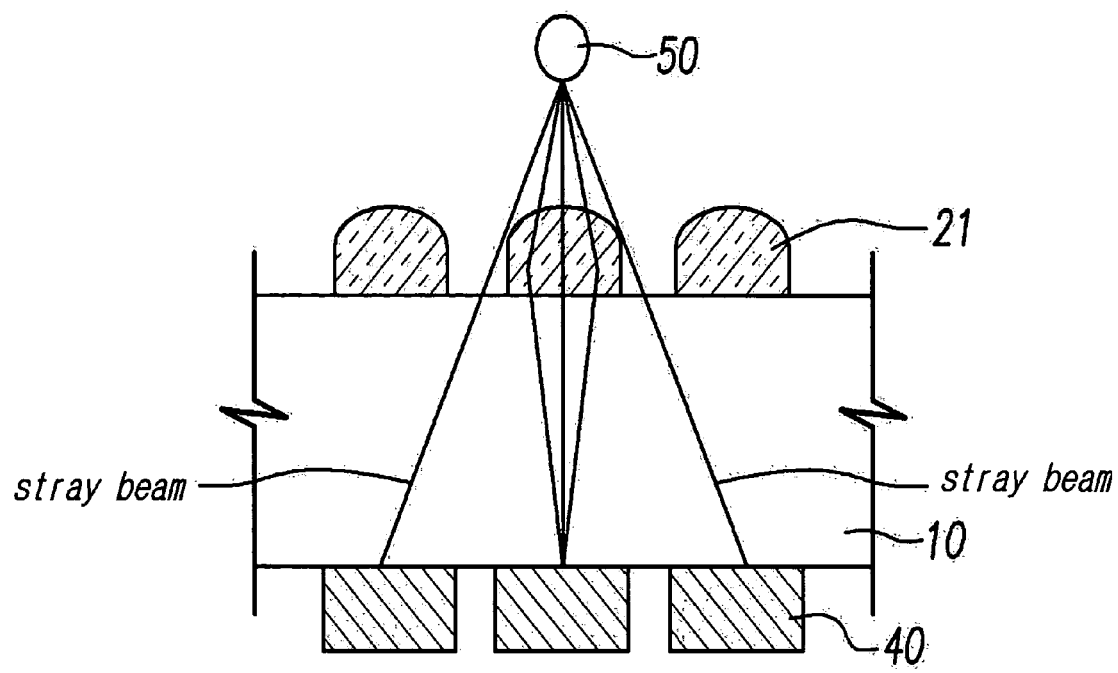

FIG. 5 is a drawing describing a stray beam passing the gap of microlenses of an image sensor of the related art.

Referring to FIG. 5, microlenses 21 formed using the defocus phenomenon and the reflow phenomenon may have various problems. For example, a gap may occur.

The image light of object 50 that may have entered through the gap between microlenses 21 may not be exactly focused on photo diode 40. The light that may have entered through the gap of microlenses 21 may go straight ahead and thus, it may be appreciated as stray beam which cannot be collected in photo diode 40 under transparent underlayer 10. Although the light transferred through microlens 21 may be focused on photo diode 40, other lights may become stray beam and may deteriorate image quality.

SUMMARY OF THE INVENTION

Embodiments relate to a CMOS image sensor and a method for manufacturing a CMOS image sensor. Embodiments relate to a method for manufacturing a microlens of a CMOS image sensor.

Embodiments relate to a method for manufacturing a CMOS image sensor for dispersing stray beams between microlenses in the CMOS image sensor.

According to embodiments, a method for manufacturing a CMOS image sensor may include forming an interlayer dielectric layer on a semiconductor substrate including a plurality of photo diodes, forming a color filter layer corresponding to the photo diodes on the interlayer dielectric layer, forming a planarization layer on the color filter layer, forming microlenses on the planarization layer, after depositing an insulating layer over the microlenses, forming a trench in a concave lens shape in the insulating layer between the microlenses, and forming a concave lens gap-filling insulating materials inside the trench.

According to embodiments, the microlens resist layer may use material having larger refractive index as compared to the insulating layer.

According to embodiments, forming the microlenses may comprise forming a microlens pattern by applying and patterning microlens resist on the planarization layer, and forming a microlens in a round shape by reflowing the microlens pattern.

According to embodiments, the microlens pattern may be reflowed using an annealing process.

According to embodiments, the insulating layer may use $SiO_2$.

According to embodiments, the trench may be formed on the insulating layer using a micro trench phenomenon.

According to embodiments, the trench may be formed by performing a rectractive ion etching (RIE) on the insulating layer to have a micro trench profile in a concave lens shape.

According to embodiments, the insulating material gap-filled inside the trench may use low temperature oxide (LTO) formed of $SiO_2$.

DRAWINGS

Figure 1:
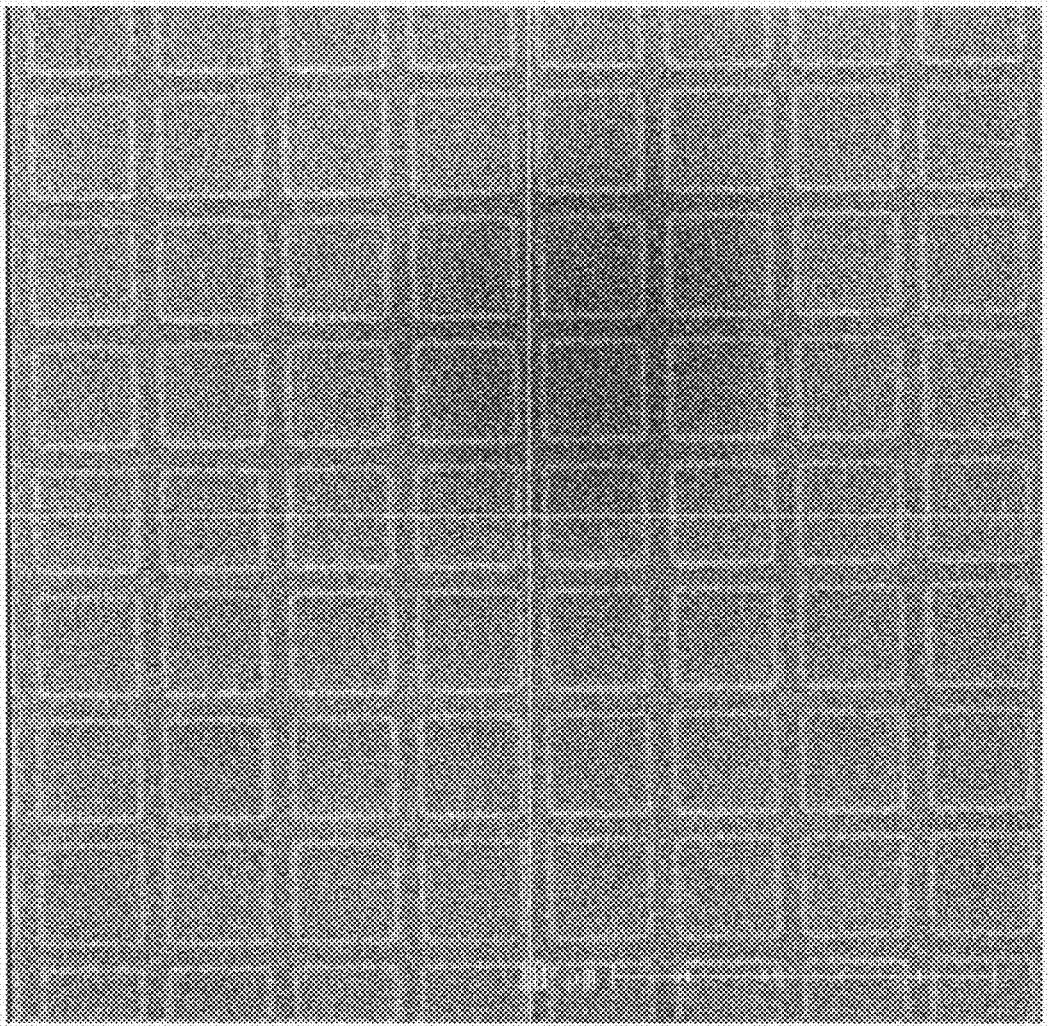
FIGS. 1 and 2 are drawings for describing a microlens of an image sensor of the related art.
Figure 2:
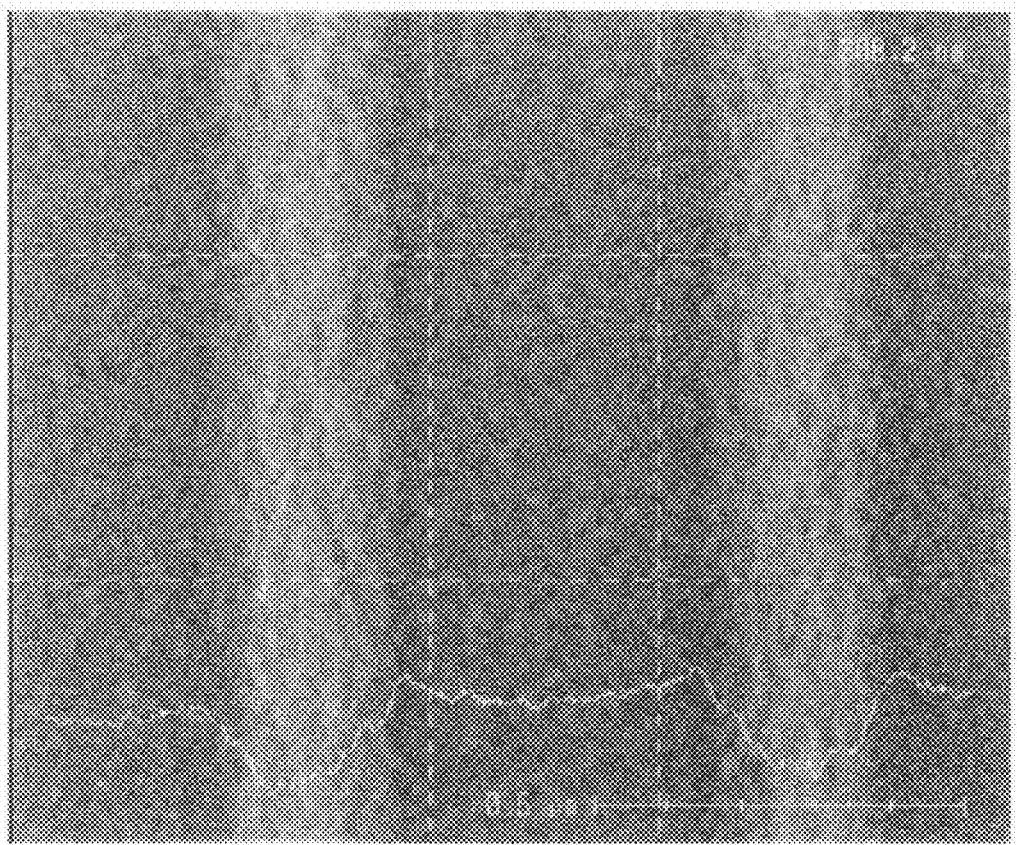

FIGS. 1 and 2 are drawings for describing a microlens of an image sensor of the related art;

FIGS. 3 and 4 are process cross-sectional drawings illustrating a method for manufacturing a microlens of an image sensor of the related art.

FIG. 5 is a drawing for describing stray beam passing the gap of microlenses of an image sensor of the related art.

FIGS. 6a to 6e are process cross-sectional drawings showing a method for manufacturing a CMOS image sensor according to embodiments.

Figure 7:
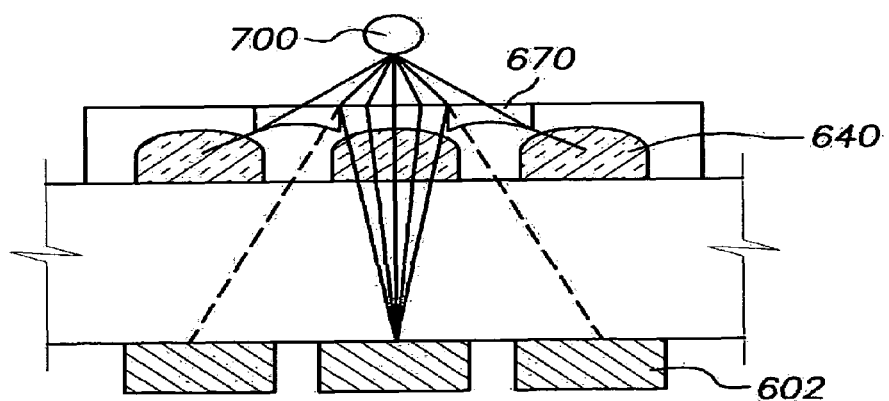

FIG. 7 is a drawing for describing stray beam passing the gap of microlenses of an image sensor of the present invention.

DESCRIPTION

FIGS. 6a to 6e are process cross-sectional drawings showing a method for manufacturing a CMOS image sensor according to embodiments.

Figure 6A:
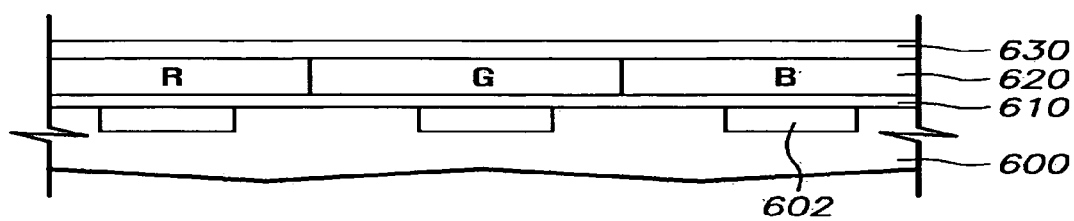

Referring to FIG. 6a, interlayer dielectric layer 610 may be formed on semiconductor substrate 600 formed with a plurality of photo diodes 602 and a transistor (not shown). Interlayer dielectric layer 610 may also be formed in a multi layer fashion Although not shown in the drawing, after one interlayer dielectric layer is formed, a shielding layer may be formed to prevent the incidence of light on portions other than photo diode region 602.

The interlayer dielectric layer may be formed again.

According to embodiments, after applying dyeable resist on interlayer dielectric layer 610, an exposure and development processes may be performed to form color filter layer 620 filtering light according to the respective wavelength ranges.

According to embodiments, planarization layer 630 may be formed on color filter layer 620 and may provide a substantially flat and even surface for controlling a focal length and forming a lens layer.

Figure 6B:
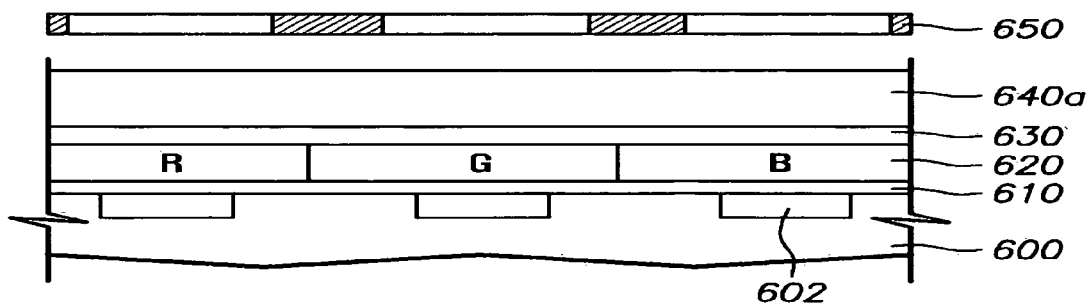

Referring to FIG. 6b, microlens resist layer 640a may be applied on planarization layer 630. Reticle 650 having apertures on the upper of resist layer 640a may be arranged, and light such as laser may be irradiated over semiconductor substrate 600 including reticle 650. Thus may selectively expose the resist layer 640a. At this time, the resist layer 640a may use material having larger refractive index as compared to the insulating layer 660.

Figure 6C:
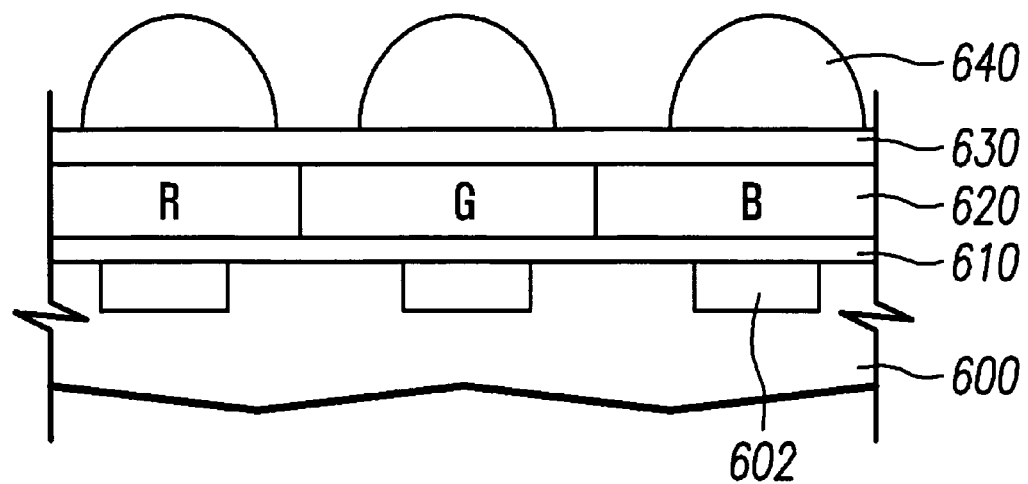

Referring to FIG. 6c, after a microlens pattern (not shown) may be formed developing the exposed resist layer 640a, the microlens pattern (not shown) may be reflowed at a predetermined temperature and may form hemispherical microlenses 640.

Figure 6D:
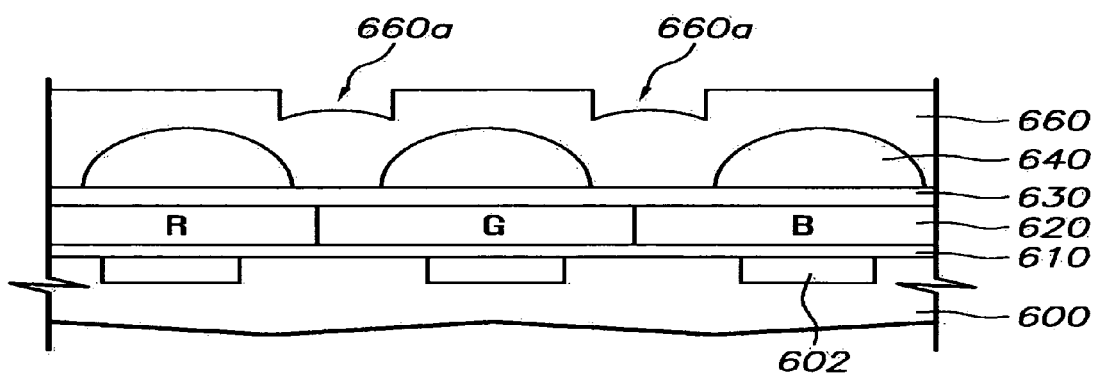

Referring to FIG. 6d, after an insulating layer 660 may be deposited and planarized over the semiconductor substrate 600 formed with the microlenses 640, trenches 660a may be formed in the insulating layer 660 between the microlenses 64 using a micro trench phenomenon. According to embodiments, the trenches may be formed using a reactive ion etching (RIE) and may have a micro trench profile in a concave lens shape. According to embodiments, the insulating layer 660 may use $SiO_2$ and the trenches 660a may be formed under prescribed conditions, such as with Pressure of 5~300 mT, Source Power of 50~2000 W, Bias Power of 50~2000 W, O2 gas of 1~50 sccm, CF4 gas 1~200 sccm, CH2F2 gas 1~10 sccm, Ar gas 10~900 sccm, and N2 gas 10~200 sccm.

Figure 6E:
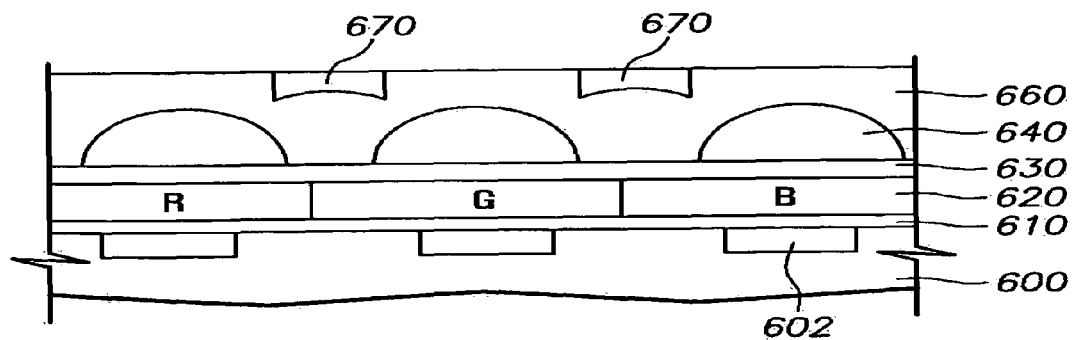

Referring to FIG. 6e, concave lenses 670 may be formed inside trenches 660a and may have a concave lens shape by gap-filling low temperature oxide (LTO) formed of $SiO_2$.

According to embodiments, refractive layers formed of $SiO_2$ may be formed on the microlenses 640 and all or substantially all of the light entering from an object may be collected into the photo diodes 602. According to embodiments, the stray beam between the microlenses 640 may be dispersed and condensed again into neighboring microlenses 640, making it possible to improve image quality.

FIG. 7 is a drawing for describing a stray beam passing the gap of microlenses of an image sensor According to embodiments.

Referring to FIG. 7, the image light of an object 700 that may have entered through the gap of the microlenses 640 may be focused on the photo diodes 602. Also, concave lenses 670 formed between the microlenses 640 may disperse stray beams to be recondensed into the neighboring microlenses 640. This may make it possible to collect more light on the photo diodes 602.

According to embodiments, concave lenses may be formed between microlenses in a CMOS image sensor so that stray light beams between the microlenses may be dispersed using the concave lenses and the dispersed stray beams may be recondensed into the microlenses to be collected into photo diodes so that image quality may be improved.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method, comprising:
    forming an interlayer dielectric layer over a semiconductor substrate including a plurality of photo diodes;
    forming a color filter layer corresponding to locations of the photo diodes over the interlayer dielectric layer;
    forming a planarization layer over the color filter layer;
    forming microlenses over the planarization layer;
    depositing an insulating layer over the microlenses;
    forming a trench having a concave lens shape in the insulating layer between the microlenses; and
    forming a concave lens gap-filling insulating material inside the trench.

2. The method of claim 1, wherein forming the microlenses comprises:
    forming a microlens pattern by applying and patterning a microlens resist layer over the planarization layer; and
    forming each of the microlenses in a round shape by reflowing the microlens pattern.

3. The method of claim 2, wherein the microlens resist layer comprises material having larger refractive index than that of the insulating layer.

4. The method of claim 2, wherein the microlens pattern is reflowed using an annealing process.

5. The method of claim 1, wherein the insulating layer comprises $SiO_2$.

6. The method of claim 1, wherein the trench is formed over the insulating layer using a micro trench phenomenon.

7. The method of claim 1, wherein the trench is formed by performing a rectractive ion etching (RIE) on the insulating layer to form a micro trench profile having a concave lens shape.

8. The method of claim 1, wherein the gap-filling insulating material inside the trench comprises a low temperature oxide (LTO) comprising $SiO_2$.

9. The method of claim 1, wherein the trench is formed in a process condition with a Pressure of 5~300 mTorr, a Source Power of 50~2000 W, a Bias Power of 50~2000 W, and O2 gas of 1~50 sccm.

10. The method of claim 1, wherein the trench is formed in a process condition with CF4 gas of 1~200 sccm, CH2F2 gas of 1~10 sccm, Ar gas of 10~900 sccm, N2 gas of 10~200 sccm.

11. A device, comprising
    an interlayer dielectric layer over a semiconductor substrate including a plurality of photo diodes;
    a color filter layer corresponding to locations of the photo diodes over the interlayer dielectric layer;
    microlenses over the color filter layer;
    an insulating layer over the microlenses;
    a trench having a concave lens shape in the insulating layer between the microlenses; and
    a concave lens gap-filling insulating material inside the trench.

12. The device of claim 11, further comprising a planarization layer over the color filter layer, wherein the microlenses are formed over the planarization layer.

13. The device of claim 12, wherein the microlenses are formed by forming a microlens pattern by applying and patterning a microlens resist layer over the planarization layer, and forming each of the microlenses in a round shape by reflowing the microlens pattern.

14. The device of claim 13, wherein the microlens resist layer comprises material having larger refractive index than that of the insulating layer.

15. The device of claim 14, wherein the microlens pattern is reflowed using an annealing process.

16. The device of claim 15, wherein the insulating layer comprises $SiO_2$.

17. The device of claim 15, wherein the gap-filling insulating material inside the trench comprises a low temperature oxide (LTO) comprising $SiO_2$.

18. The device of claim 12, wherein the trench is formed in a process condition with a Pressure of 5~300 mTorr, a Source Power of 50~2000 W, a Bias Power of 50~2000 W, and O2 gas of 1~50 sccm.

19. The device of claim 12, wherein the trench is formed in a process condition with CF4 gas of 1~200 sccm, CH2F2 gas of 1~10 sccm, Ar gas of 10~900 sccm, N2 gas of 10~200 sccm.

* * * * *